(12) United States Patent
Akram

(10) Patent No.: US 6,785,144 B1
(45) Date of Patent: Aug. 31, 2004

(54) HIGH DENSITY STACKABLE AND FLEXIBLE SUBSTRATE-BASED DEVICES AND SYSTEMS AND METHODS OF FABRICATING

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 603 days.

(21) Appl. No.: 09/645,373

(22) Filed: Aug. 24, 2000

Related U.S. Application Data

(62) Division of application No. 09/329,586, filed on Jun. 10, 1999, now Pat. No. 6,617,671.

(51) Int. Cl.[7] .............................. H05K 7/06; H05K 7/08
(52) U.S. Cl. ...................... 361/749; 361/771; 361/803; 361/808; 361/813; 257/686; 257/723
(58) Field of Search ................................. 361/749–753, 361/757, 807, 808, 813, 771, 803; 257/686, 723, 777, 778; 174/254

(56) References Cited

U.S. PATENT DOCUMENTS

| | | | |
|---|---|---|---|
| 4,026,011 A | * | 5/1977 | Walton ........................ 29/846 |
| 4,555,151 A | | 11/1985 | Neese et al. |
| 4,907,128 A | | 3/1990 | Solomon et al. |
| 4,958,261 A | * | 9/1990 | Huerre ....................... 361/807 |
| 4,991,927 A | | 2/1991 | Anstey |
| 5,014,161 A | * | 5/1991 | Lee et al. .................... 361/709 |
| 5,089,880 A | | 2/1992 | Meyer et al. |
| 5,229,960 A | | 7/1993 | De Givry |
| 5,247,423 A | | 9/1993 | Lin et al. |
| 5,313,416 A | | 5/1994 | Kimura |
| 5,343,366 A | | 8/1994 | Cipolla et al. |
| 5,384,690 A | | 1/1995 | Davis et al. |
| 5,435,733 A | | 7/1995 | Chernicky et al. |
| 5,438,224 A | * | 8/1995 | Papageorge et al. ........ 257/777 |
| 5,440,171 A | | 8/1995 | Miyano et al. |
| 5,471,151 A | | 11/1995 | DiFrancesco |
| 5,585,675 A | | 12/1996 | Knopf |
| 5,620,782 A | | 4/1997 | Davis et al. |
| 5,637,907 A | | 6/1997 | Leedy |
| 5,715,143 A | | 2/1998 | McHugh et al. |
| 5,729,897 A | | 3/1998 | Schmidt et al. |
| 5,761,795 A | | 6/1998 | Ohta |
| 5,776,797 A | | 7/1998 | Nicewarner, Jr. et al. |
| 5,781,415 A | | 7/1998 | Itoh |
| 5,798,014 A | | 8/1998 | Weber |
| 5,838,546 A | | 11/1998 | Miyoshi |
| 5,854,534 A | * | 12/1998 | Beilin et al. ................. 257/691 |

(List continued on next page.)

FOREIGN PATENT DOCUMENTS

JP    2000-138265    5/2000

OTHER PUBLICATIONS

U.S. patent application, Pub. No. US 2002/0001020 A1, to Mrvos et al., published Jan. 3, 2002.

*Primary Examiner*—John B. Vigushin
(74) *Attorney, Agent, or Firm*—TraskBritt

(57) ABSTRACT

A flexible carrier substrate assembly or module that facilitates stacking of multiple carrier substrates bearing semiconductor dice for high density electronic systems. After the dice are placed on the flexible substrate, a flexible support frame may be applied to the flexible substrate. The support frame includes conductive paths therethrough to connect to circuit traces running from the dice on the substrate to the substrate perimeter to interconnect superimposed carrier substrates. The flexible carrier substrates may be bent to a radius of any given curvature to conform to various non-planar regular and irregular surfaces. Furthermore, since the frame as well as the substrate may be flexible, multiple, flexible substrate assemblies may be stacked one on top of another wherein an upper assembly has a different radius than a lower module and any intermediate assemblies have progressively differing radii from bottom to top position.

20 Claims, 4 Drawing Sheets

U.S. PATENT DOCUMENTS

| | | |
|---|---|---|
| 5,927,193 A | 7/1999 | Balz et al. |
| 5,986,886 A | 11/1999 | Sasov |
| 5,991,161 A * | 11/1999 | Samaras et al. ............ 361/760 |
| 5,992,649 A | 11/1999 | Wark et al. |
| 6,027,958 A | 2/2000 | Vu et al. |
| 6,049,975 A | 4/2000 | Clayton |
| 6,051,877 A | 4/2000 | Usami et al. |
| 6,061,245 A | 5/2000 | Ingraham et al. |
| 6,064,217 A | 5/2000 | Smith |
| 6,086,386 A | 7/2000 | Fjelstad et al. |
| 6,104,089 A | 8/2000 | Akram |
| 6,121,676 A | 9/2000 | Solberg |
| 6,191,478 B1 | 2/2001 | Chen |
| 6,222,737 B1 * | 4/2001 | Ross .......................... 361/767 |
| 6,256,203 B1 | 7/2001 | Ingraham et al. |
| 6,310,667 B1 | 10/2001 | Nakayoshi et al. |
| 6,323,891 B1 | 11/2001 | Kitani et al. |
| 6,421,013 B1 | 7/2002 | Chung |

* cited by examiner

HIGH DENSITY STACKABLE AND FLEXIBLE SUBSTRATE-BASED DEVICES AND SYSTEMS AND METHODS OF FABRICATING

CROSS-REFERENCE TO RELATED APPLICATION

This application is a divisional of application Ser. No. 09/329,586, filed Jun. 10, 1999, now U.S. Pat. No. 6,617,671, issued Sep. 9, 2003.

BACKGROUND OF THE INVENTION

1. Field of the Invention

The present invention relates generally to flexible circuits for semiconductor devices and, more specifically, to a flexible carrier substrate for use with semiconductor devices that facilitates high density stacking of the semiconductor devices.

2. State of the Art

Integrated circuit devices are commonly mounted on circuit boards and connected to conductive patterns formed on the circuit boards. Wire bonds may be used to interconnect the integrated circuit (IC) devices to traces of a conductive pattern formed on a circuit board. Each wire is bonded to both a bond pad of the IC device and a terminal pad formed at the end of a trace of the conductive pattern on the circuit board.

Wire bonding techniques are well known in the art and are highly reliable in most applications. Unfortunately, in a few applications, difficulties do occur. These applications exist when the IC device is small and the available area for connecting to the bond pads is limited. The process of reliably connecting wire bonds to small, closely spaced bond pads is both tedious and expensive. Both ends of the wire bond must be accurately placed to avoid contacting adjacent pads on the IC device and the circuit board, respectively. Moreover, the wire must be sufficiently welded to the conductive bond pads to ensure a secure connection with good electrical contact and without damaging the IC device or the supporting circuit board.

To provide greater circuit density, circuit boards can be layered together in stacks and then interconnected electrically. This results in three-dimensional modules as the circuit boards are stacked one upon another. In stacking circuit boards one upon another, board production techniques become even more complex than before. This is because each layer may be different, requiring different circuit layouts and putting a strain on the ability of the assembly process to maintain dimensional tolerances that would not be as troublesome in a single layer interconnect layout assembly.

Another challenge in the art is an inability in some circumstances to provide a flat, smooth surface on which to mount a printed circuit board. Accordingly, flexible circuit boards have been developed to promote both lighter structures and greater adaptability to conforming to nonuniform surfaces. Unfortunately, the arrival of flexible circuit boards has resulted in other problems, such as the problem in joining several boards while effecting and maintaining a proper interconnection between the respective boards. Further, in some applications, where preclusion of ICs mounted on a lower circuit board from touching a higher circuit board is required, providing a rigid assembly to support the stacked circuit boards is useful. Unfortunately, this approach compromises the flexibility that would otherwise allow the circuit boards to conform to a non-planar surface.

One example of integrated circuit devices mounted upon flexible, stackable circuit boards to form semiconductor modules is disclosed in U.S. Pat. No. 5,440,171 entitled "Semiconductor Device with Reinforcement," issued Aug. 8, 1995 ("the '171 patent). The '171 patent discloses a basic structural unit that uses a flexible circuit board made from a polyimide film with circuit lines formed on both sides, typically using copper foil. A supporting frame is provided and is bonded to the flexible circuit board with a heat resistant resin, such as a polyimide resin. Electrical connection is possible between the flexible circuit board and the support frame, which may include a plurality of layers. Conductive through holes are provided so that electrical continuity may be maintained between a semiconductor device mounted upon the flexible circuit board and either at least one other semiconductor device mounted on another flexible circuit board stacked within the module assembly, or an external structure upon which the entire basic structural unit is mounted. The semiconductor devices are electrically connected to electrodes formed on the support frame.

Although a semiconductor device in the '171 patent is mounted on a flexible circuit board that is stackable with other circuit boards in a three-dimensional arrangement, the support frame attaching the stackable circuit boards one to another is made from a rigid material that does not allow for any bending at all. For example, one type of frame material suggested in the '171 patent is a ceramic such as alumina or silicon nitride. Such materials may be used for high thermal conductivity to promote heat transfer from high power consumption semiconductor devices mounted on the flexible circuit board. However, because the support frame is made from an extremely rigid and non-flexible material, the entire semiconductor structure utilizing the stackable circuit boards and support frames must necessarily comprise a series of parallel, superimposed layers and must be mounted upon a substantially planar surface. This prevents the assembly from conforming to non-planar surfaces.

Accordingly, what is needed is a flexible circuit board having an associated support frame that overcomes the problems of the conventional practice of utilizing a rigid support frame and is readily adaptable for stacking in multiple layers. Additionally, the improved flexible circuit board with stackable support frame should be more easily assembled and mounted than was possible with prior art structures when disposed upon non-planar surfaces.

SUMMARY OF THE INVENTION

According to the present invention, a flexible substrate module or assembly is disclosed that facilitates stacking of multiple flexible carrier substrates to simplify the assembly of high density electronic systems. Integrated circuit semiconductor devices in the form of chips or dice are connected active surface side down to a flexible carrier substrate in a so-called "flip-chip" orientation using solder bumps or other discrete conductive bumps or elements. Such conductive connecting elements may be formed either on the die itself or on the flexible substrate. After the dice are placed on and secured to the flexible carrier substrate, a frame, preferably offering a significant degree of flexibility, is applied to the flexible carrier substrate to surround the perimeter thereof. The flexible frame includes conductive paths therethrough in the form of conductively plated through holes, electrical conductor-filled vias, or preformed conductive elements, which conductive paths connect to circuit traces on the flexible carrier substrate extending from the electrical connections of the dice thereto on the interior region of the flexible carrier substrate to the flexible carrier substrate perimeter. This feature permits operational stacking of multiple flexible carrier substrates for cooperation between semiconductor dice mounted on different-level flexible carrier substrates and between all components of the stacked assembly and external, higher-level packaging by providing electrical interconnection between the various flexible carrier substrates. Since the flexible carrier substrates may be extremely flexible, they may be formed to a radius of substantially any given curvature, providing the ability to conform to various non-planar, arcuate or non-arcuate, regular or irregular surfaces. Further, the flexible carrier substrates exhibit substantial flexibility so as to provide significant bending angles, permitting mounting of the flexible carrier substrates to many structures having non-planar surfaces. Furthermore, since the perimeter frame as well as the carrier substrate may be flexible, multiple flexible carrier substrate modules, each comprising a flexible carrier substrate and associated frame, may be stacked one on top of another in superimposed arcuate configurations, wherein the top module may have a smaller or larger radius of curvature than the bottom module and any modules in between have progressively differing radii from bottom to top position.

Mounting multiple modules in a stacked configuration with differing module radii may be accomplished by attaching first ends of a plurality of modules comprising superimposed flexible carrier substrates and support frames and then sequentially attaching second ends of the modules after a given radius is established for each lower module. In an alternative assembly technique, the first and second ends of a first flexible carrier substrate may be attached to a desired surface. Next, a flexible support frame is then attached to a first end and then a second end of the first flexible carrier substrate. Next, a second flexible carrier substrate may be attached to the first and second ends of the first frame and the process repeated in layers until a desired, completed structure is formed.

DETAILED DESCRIPTION OF THE INVENTION

Figure 1:
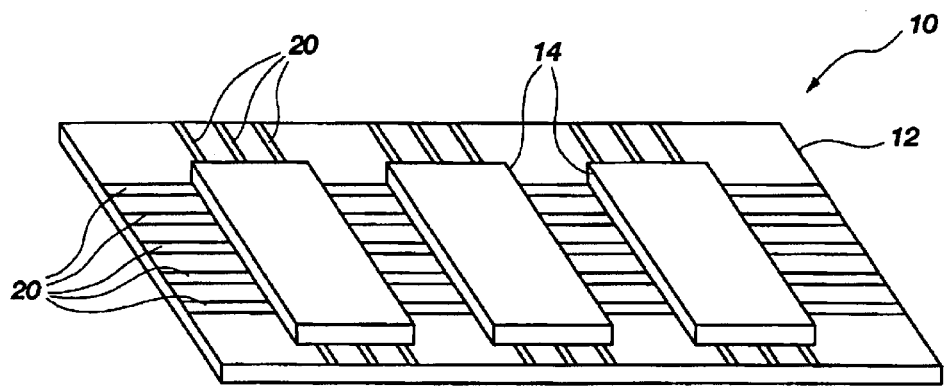
FIG. 1 is a perspective view of a flexible carrier substrate according to the invention having semiconductor dice conductively attached to an upper surface thereof.

FIG. 1 depicts a flexible carrier substrate assembly or module 10 including a flexible carrier substrate 12. A plurality of semiconductor dice 14 is attached to the surface of flexible carrier substrate 12 in a flip-chip orientation. Semiconductor dice 14 may be selected from any type of semiconductor device such as, for example, memory devices, central processing units, signal processing units, controller devices, or any combination of these or other devices.

Flexible carrier substrate 12 may be fabricated from any type of flexible, conductive material such as a flexible laminate comprising a metal cladding adhered to a dielectric substrate, such as, for example, a polyimide film, a resin-impregnated fabric or a synthetic fabric. The flexible laminate typically is thinner than a rigid composite and can be freely formed over, or conformed to, a particular non-planar surface or structure. The flexible laminate may be less than 0.25 mm in total thickness. The dielectric thickness selection is significant to the end use for the carrier substrate in terms of required flexibility. Thinner materials may be used for dynamic or continuous flexing applications, while thicker materials may be used for intermittent flexing and flexing during installation, or where flexing with some degree of structural self-support is desired or required. Dynamic or continuous flexing applications may include, but are not limited to, repeatedly and frequently opening and closing connection points such as entryways, portable clamshell computer hinge points, personal electronic organizer hinge points, or cellular phone hinge points. Occasional flexing applications may include portable clamshell computer boards, personal electronic organizer boards, cellular phone boards, desktop computer boards, server boards and motor vehicle and aircraft-mounted computer system boards.

The metal cladding may include, without limitation, copper foil, beryllium copper, aluminum, and Invar®, and conductive polymer thick films may also be employed to fabricate conductors. The fabrication and design of the flexible substrate 12 in this particular embodiment are a polyimide film with conductive circuit traces 20 formed on both sides using copper foil. The circuit traces may be formed by applying either a positive or negative photo resist on the foil, then patterning the photo resist and etching away exposed portions of the foil to define the traces. Afterwards, additional processing may be performed on flexible substrate 12 to place additional metals or other conductive materials at selected positions, such as bumped pads, for mechanical and electrical connection of the semiconductor dice 14 to traces 20 on flexible substrate 12.

Figure 2:
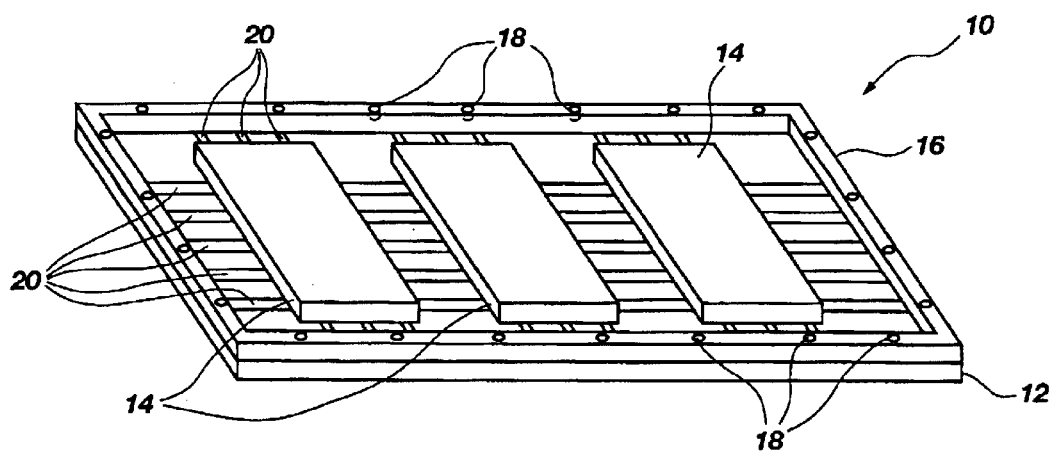
FIG. 2 depicts a flexible carrier substrate assembly, or module, according to the invention having the dice as well as a flexible support frame attached to the flexible carrier substrate.

Semiconductor dice 14 are attached to the traces 20 on a surface of flexible carrier substrate 12 using conventional attachment methods such as, for example, conductive or conductor-filled adhesive elements, solder bumps, copper or gold bumps, anisotropically conductive adhesive films, or tape automated bonding (TAB) structures comprising conductors carried on a flexible dielectric film. Circuit traces 20 extend from locations of semiconductor dice 14 attached to flexible carrier substrate 12 to locations at the outer perimeter of carrier substrate 12 under or over the locations where a flexible support frame 16 is attached to flexible carrier substrate 12 as shown in FIG. 2. Flexible support frame 16 can be made of the same material as that of flexible carrier substrate 12, or can be made from a different material with desired thermal resistivity and electrical dielectric properties as well as a similar coefficient of thermal expansion (CTE) with respect to the material of flexible carrier substrate 12. Many known polymers, resins and laminates exhibit such desirable characteristics, as known to those of ordinary skill in the art. Additionally, conductive paths 18 in the form of plated through holes, conductively filled vias, or preformed conductive elements are formed through flexible support frame 16 for interconnecting semiconductor dice 14 to other devices external to the semiconductor module formed by assembly 10, such as to a computer system in the event the semiconductor dies are DRAM chips, microprocessors, video chips, or logic chips, or to higher-level packaging for cooperation with other components in other electronic applications such as cellular phones, television systems, video cassette recorders, and the like. Circuit traces 20 are shown to connect the several semiconductor dice 14 to selected conductive paths 18 so that the semiconductor dice 14 can be connected to either other semiconductor dice 14 of other assemblies 10 within a stack or to other, external components as previously mentioned.

Figure 3:
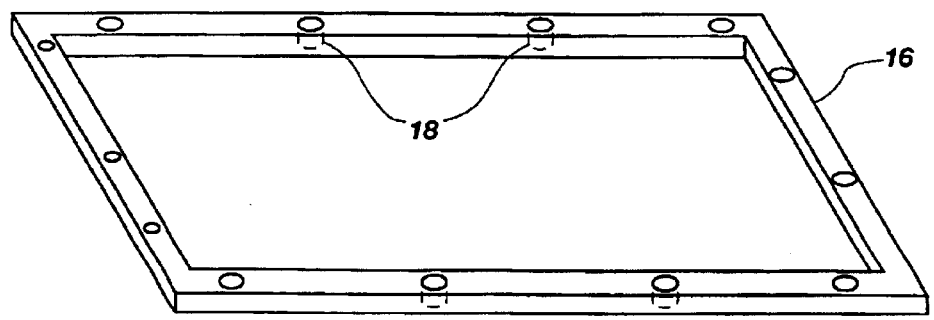
FIG. 3 illustrates a perspective view of a flexible frame according to the invention having conductive vias extending vertically therethrough.

FIG. 3 depicts a perspective view of flexible support frame 16 with conductive paths 18 extending transversely through in the form of plated through holes, conductively filled vias or preformed conductive elements. Aligned conductive paths 18 extending through superimposed flexible support frames 16 provide horizontally electrically isolated vertical conductivity between superimposed assemblies 10. Each conductive path 18 may range in size (diameter or lateral breadth), by way of example only, from about 0.05 mm to 0.8 mm. The only upper constraint on the size for conductive path 18 is that it be no larger than otherwise necessary to prevent damaging the frame or reducing the frame's support strength. If a plated through hole is employed as conductive path 18, the metal used to plate the interior walls of each plated through hole, such as, for example, copper, may have a minimum wall thickness of about 25 micrometers, or about 1 mil. A lesser thickness is possible as long as the plating employs a thickness of material adequate to provide the desired current carrying capacity without excessive resistance. If a conductive filler is employed in vias to form conductive paths 18, the filler may comprise a metal or a conductive or conductor-filed epoxy disposed in each via, or preformed, discrete conductive elements may be inserted.

Figure 4:
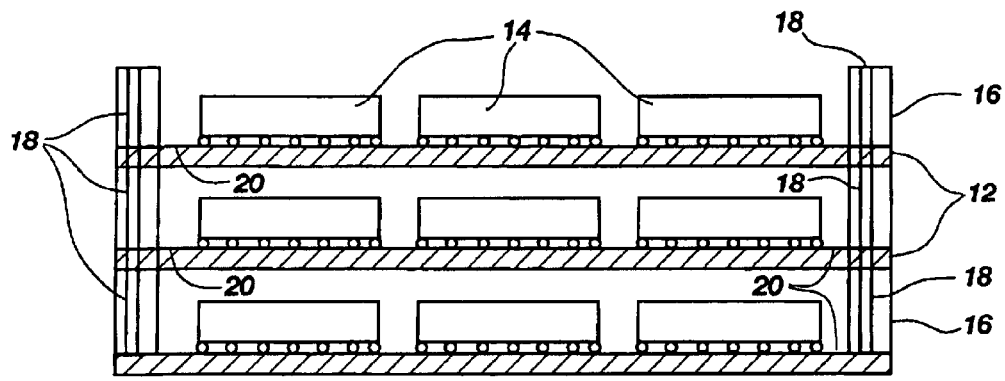
FIG. 4 illustrates a side view of a plurality of stacked flexible modules according to the invention.

FIG. 4 depicts a cross-sectional schematic diagram of a plurality of flexible carrier substrates 12, each having a plurality of semiconductor dice 14 placed upon the surface thereof, the flexible carrier substrates 12 being interspaced with flexible support frames 16. Conductive paths 18 provide electrical interconnection between semiconductor dice 14 on one substrate 12 and those on another substrate 12. The use of flexible support frames 16 provides structural strength, without adding significant weight, in comparison to prior art approaches that employ dense, heavy, rigid ceramic or resin support frames. Additionally, reliable electrical interconnection is provided by the conductive paths 18 between the various flexible carrier substrates 12 in a stack.

Further, the flexible carrier substrate 12 provides a relatively smaller resulting module, with lighter weight, and greater device or circuit density. With increased packing density, improved circuit performance is achieved. Additionally, the stacking process is simple to implement and can be used for combining a plurality of flexible assemblies 10 in the form of SIMM or DIMM modules to form a larger memory module.

Figure 5:
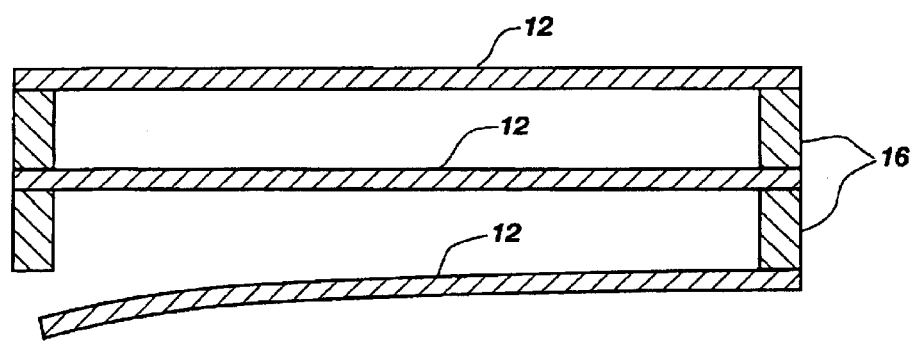
FIG. 5 depicts how a first end of one flexible carrier substrate is attached to an edge of a flexible support frame while the second end of the substrate is then attached to the second end of the flexible support frame.
Figure 6:
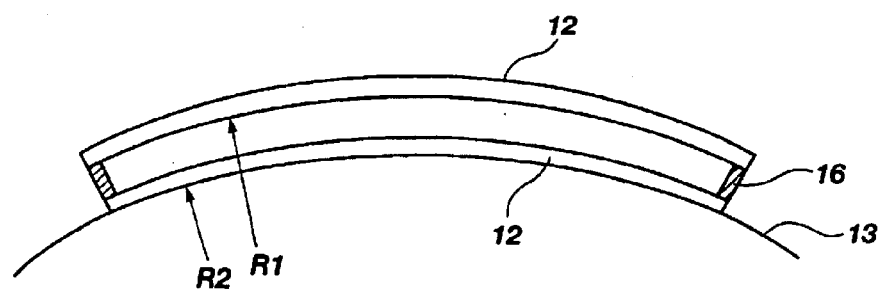
FIG. 6 depicts a first flexible carrier substrate attached to a second flexible carrier substrate via an interposed flexible support frame where the first flexible carrier substrate is curved to a radius different than that of the second substrate.

FIG. 5 is a schematic diagram of how flexible carrier substrate 12 may be attached sequentially to a first end of flexible support frame 16 and then to a second end of flexible support frame 16. In this manner, rather than attaching all edges of a flexible support frame 16 to the perimeter of a flexible carrier substrate 12 simultaneously, an assembly 10 can first be molded to conform to a particular radius or other non-planar shape. For example, FIG. 6 is a cross-sectional diagram of two arcuate flexible carrier substrates 12 interconnected via a flexible support frame 16 where a relatively longer, top substrate 12 has a smaller radius of curvature than the bottom substrate 12. R2 is greater than R1 where R1 is the radius of the top substrate 12 and R2 is the radius of the bottom substrate 12, so that the upper substrate 12 "bows" away from the lower one to provide greater clearance therebetween. If desired, the substrates 12 may be sized to provide concentric curves when in superimposition so as to exhibit substantially constant space between superimposed substrates 12. Of course, a substrate 12 may be curved to a radius to conform to a mounting surface 13, as shown.

In an alternative embodiment, support frame 16 can be made from a semi-rigid material that is pliable such as a thermosetting or thermoplastic resin. With the pliability of support frame 16, it can be molded to a particular shape before placing a flexible carrier substrate 12 upon it. Further, the pliable material utilized in support frame 16 can be cured to shape in order to provide rigidity and greater strength after the modules 10 are fabricated with the various flexible carrier substrates 12 layered in a desired configuration.

Figure 7:
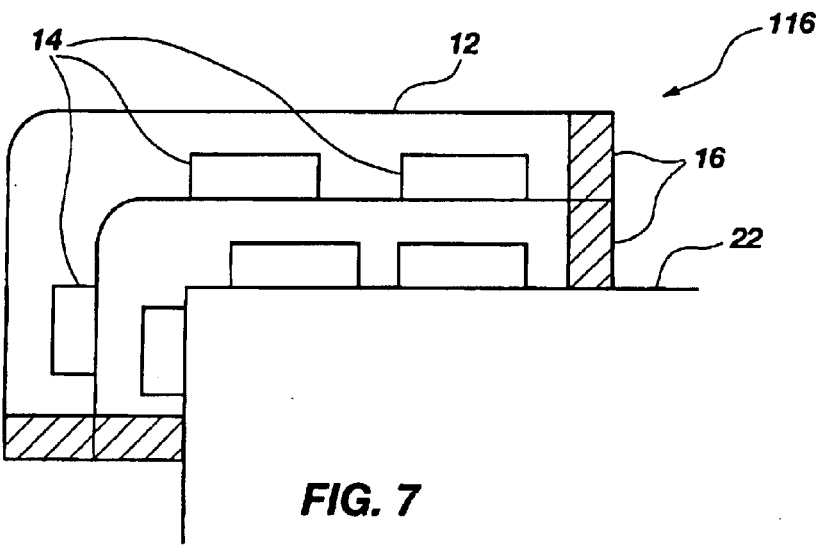
FIG. 7 depicts a plurality of flexible modules secured to an angular non-planar surface.

Another example that takes advantage of the technique of attaching the first end of a flexible carrier substrate 12 to a first portion of support frame 16 and then attaching a subsequent end of flexible carrier substrate 12 to a second portion of support frame 16 is shown in FIG. 7. FIG. 7 is a cross-sectional schematic diagram of a plurality of superimposed flexible carrier substrates 12, each bearing a plurality of semiconductor dice 14. Support frames 16 are used to support the flexible carrier substrates 12 and are configured in such a manner that a bend of 90° is achieved over the adjoining faces of structure 22. Such configurations and arrangements as well as others are also possible using the combination of a plurality of flexible carrier substrates 12 with a multiple substrate support frame 116 as shown alternatively in FIG. 7. These various configurations are possible in that both multiple substrate support frame 116 and flexible carrier substrates 12 can be utilized in a plurality of combinations where either the flexible carrier substrates 12 are placed on structure 22 already secured to support frame 116, or support frame 116 may be arranged over a particular surface such as structure 22 with flexible carrier substrates 12 then subsequently secured to support frame 116.

Figure 8:
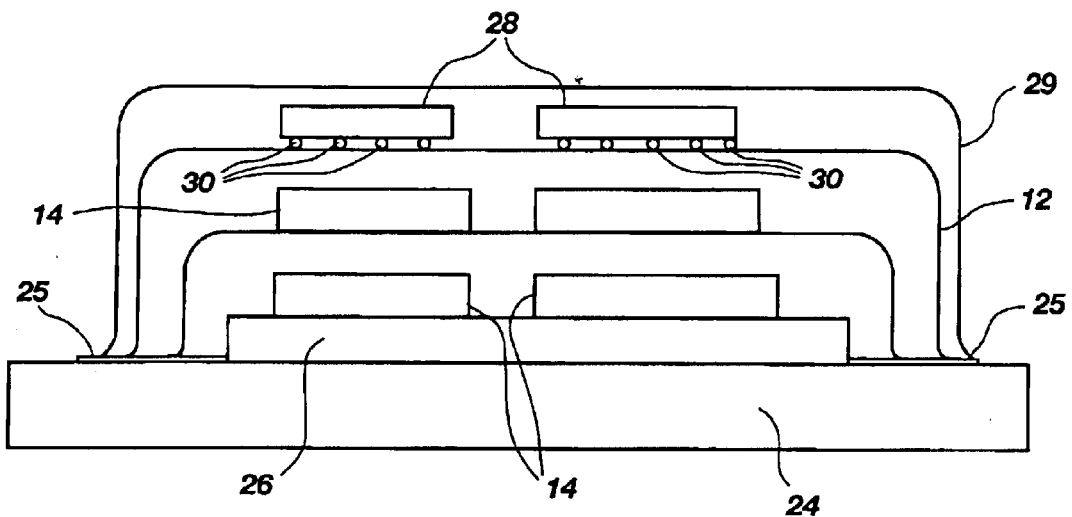
FIG. 8 depicts a plurality of flexible carrier substrates mounted in a vertical stack laminate arrangement.

FIG. 8 is a cross-sectional schematic diagram of a plurality of flexible carrier substrates 12 mounted and stacked in a laminate form. A single, preferably rigid, base substrate 24 is provided that can be selected from any type of rigid printed circuit board material such as, for example, fiberglass resin boards including FR-4 and FR-5, silicon, ceramics, or molybdenum. Mounted to the surface of base substrate 24 may be a second carrier substrate 26. Carrier substrate 26 can be either flexible or rigid, depending upon the requirements of the design. A plurality of semiconductor dice 14 is mounted to carrier substrate 26. Semiconductor dice 14 are mounted to carrier substrate 26 in a surface mount fashion such as by using tape-automated bonding (TAB) techniques. Alternatively, base substrate 24 may be provided with traces and dice 14 mounted directly thereto.

Alternatively, semiconductor dice 14 may be mounted using solder balls or other discrete conductive elements. A first flexible carrier substrate 12 is provided that connects at each end thereof to the surface of base substrate 24 and covers the dice carried by substrate 26 (or 24, as the case may be). Interconnect conductor traces 25 are fabricated on the surface of substrate 24 to allow interconnection between the semiconductor dice 14 placed on first flexible carrier substrate 12 to the dice 14 placed on carrier substrate 26 as well as any other dice connected to base substrate 24, or to other components external to base substrate 24. Next, a second flexible carrier substrate 12 is disposed over first flexible carrier substrate 12 and connected at each end thereof to the surface of substrate 24.

A plurality of semiconductor dice 28 is attached to second flexible carrier substrate 12 and electrically connected to conductor traces 25. Semiconductor dice 28 may, by way of example, be attached to the surface of second flexible carrier substrate 12 by solder balls 30. Solder balls 30 are generally formed of a lead-tin or lead-silver alloy on bond pads of a die 28, and then reflowed to provide electrical and mechanical connection to terminals or contact pads on the surface of second flexible carrier substrate 12. Other discrete conductive elements as known in the art may be employed in lieu of solder balls 30. Finally, a cover 29 may be provided over the entire assembly. This can be another flexible substrate without circuit traces thereon, having its ends attached to the surface of base substrate 24. Alternatively, the cover 29 may be a hermetic, resin sealant that protects the dice 14 and 28 from moisture and dust, or may comprise a preformed dome-shaped member of any other suitable material sealed at its periphery to base substrate 24. The arrangement of FIG. 8 has the advantage of eliminating the need for support frames 16. Further, this approach facilitates connection of all of the flexible carrier substrates 12 to a single base substrate 24. Further still, the laminated but frameless design of FIG. 8 makes it easy to replace individual flexible carrier substrates as required.

Figure 9:
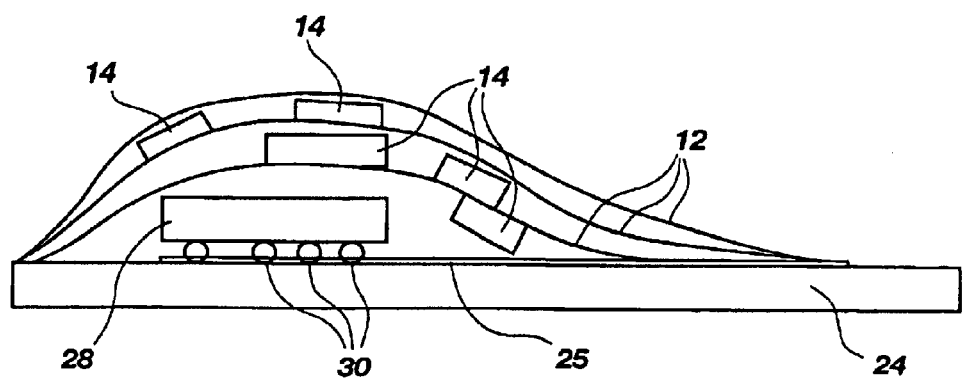
FIG. 9 depicts a plurality of superimposed flexible carrier substrates with attached dies mounted in a substantially planar, low-profile, laminate design.

FIG. 9 is a cross-sectional schematic diagram of a similar arrangement of that of FIG. 8, but where the plurality of substrates 12 are connected to rigid base substrate 24 in a more tapered, lower profile, design. In this example, a semiconductor die 28 can be attached to traces 25 on the surface of a rigid substrate 24 via a plurality of solder balls 30 or other discrete conductive elements. Next, a flexible carrier substrate 12 is placed over semiconductor die 28 and attached in a substantially planar arrangement over that of FIG. 8. At least one semiconductor die 14 can be attached to substrate 12. Additional flexible carrier substrates 12 can be applied to rigid substrate 24 and a laminated, more planar design can be achieved with a smaller vertical height. This arrangement is desirable when the dice 14 and 28 are of such a dimension that a nearly flat surface can be achieved in a stacking arrangement and a low profile, very dense structure is desired, as for SIMM or DIMM memory modules, laptop computers, personal digital assistants, cellular phones, and other compact electronic devices. This embodiment may be utilized when space is limited and a high chip stack cannot fit within the volume constraints of the electronic device. Further, this arrangement reduces electrical parasitics, and the close spacing of the dice 14 leads to better electrical performance.

Figure 10:
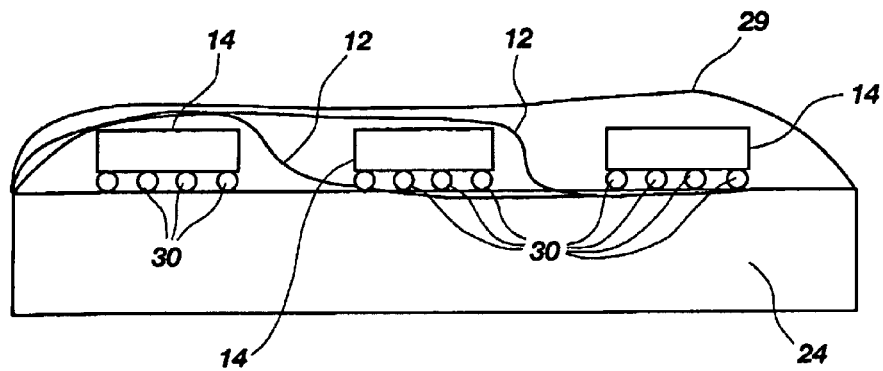
FIG. 10 depicts a plurality of flexible carrier substrates bearing dice and mounted in a substantially planar interleaved laminate design.
Figure 11:
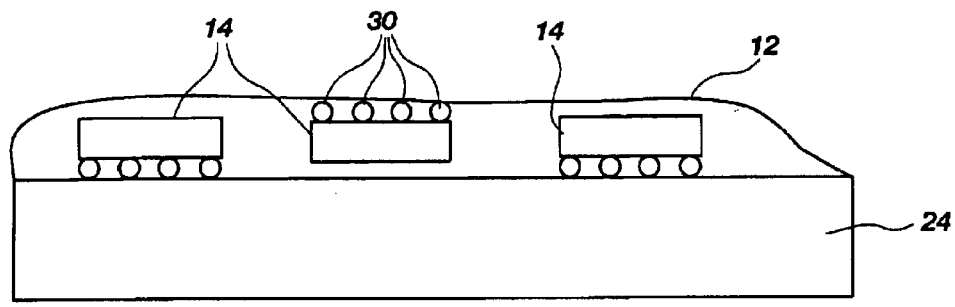
FIG. 11 depicts a plurality of dice mounted in a flexible carrier substrate assembly wherein at least one die is mounted in an inverted position upon a flexible carrier substrate relative to the other dice.

In yet additional embodiments, the flexible carrier substrates 12 can be interleaved so that a plurality of semiconductor dies 14 are placed in a substantially coplanar arrangement with one another as shown in FIG. 10. This arrangement is also frameless and may again employ a base substrate 24. Yet another embodiment is depicted in FIG. 11, where selected dice 14 of a plurality of dice 14 are placed upon the base substrate 24 in a conventional flip-chip orientation while one or more additional dice 14 are mounted in an upside down flip-chip orientation to a bottom surface of a flexible carrier substrate 12 that is then attached at its ends to base substrate 24 either with or without a frame. In such an arrangement, the flexible carrier substrate 12 also serves as a cover for the dice 14 mounted to base substrate 24.

The use of a flexible carrier substrate of the invention rather than a rigid dielectric substrate such as a conventional printed circuit board has several advantages. These advantages include increased mechanical strength and vibration-dampening capability, as well as improved dielectric properties in comparison to rigid boards having the same relative thickness. Also, they provide space savings and weight reduction over the prior rigid dielectrics used. Additionally, greater impedance control and contact resolution (by way of example, reduction of pitch to 8 to 6 mils and extendible to 4 mils) can be achieved using the flexible substrates, providing superior electrical performance, which is also facilitated by the tighter geometries and therefore higher circuit densities which may be obtained using the flexible substrates. Additionally, mechanical flexing of the substrates may be readily used to conform to unusual and complex structural geometries not otherwise possible using conventional rigid materials. This flexing can be either continuous (i.e., a bend along a single radius) or intermittent or variable along the length of a flexible substrate. Further, when multiple flexible substrates are stacked upon one another, particularly when using support frames, additional rigidity of the overall module is achieved. Unlike conventional, rigid substrate approaches, wherein the rigidity is primarily in a single plane and bending or torsional degradation of a circuit structure may still occur, rigidity using the present invention can be achieved in an arcuate configuration or by using an abrupt, non-planar directional change that would not otherwise be possible using rigid, planar substrates. Properly engineered and configured as required with appropriate cross-members, an assembly of flexible substrates with one or more supporting frames according to the invention may provide rigidity under loads applied from any direction or particularly critical directions. Additionally, the flexible carrier substrate of the invention in combination with a stackable support frame facilitates fabrication of the assembly upon structures exhibiting greater non-planarity than was previously possible using conventional techniques for mounting, support and electrical connection of dice.

Figure 12:
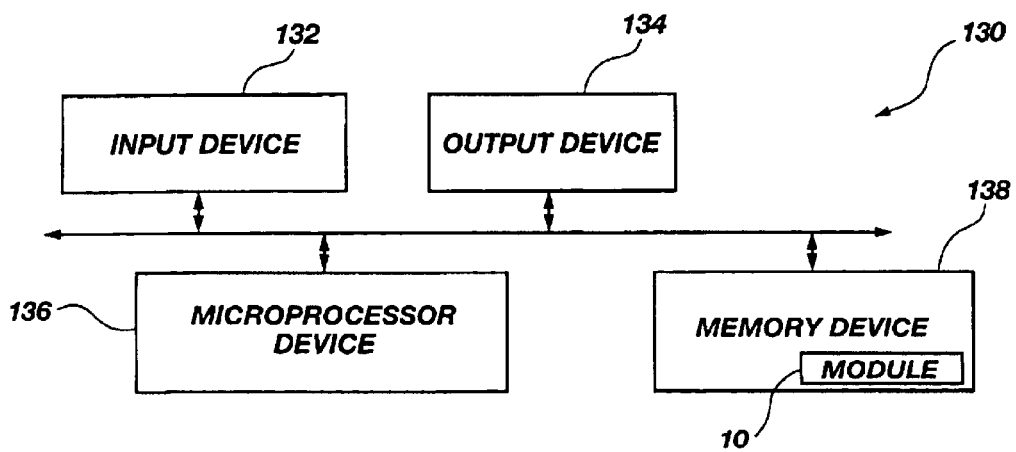
FIG. 12 is a block diagram of an electronic system incorporating a flexible stackable module according to the invention.

FIG. 12 depicts an electronic system 130 including an input device 132 and an output device 134 coupled to a processor device 136 which, in turn, is coupled to a memory device 138 incorporating a flexible stackable assembly 10 of any of the various embodiments thereof as depicted in, and described with respect to, FIGS. 1–11. For example, an entire, operable computer system may be assembled using stacked assemblies of the present invention. By way of example only, a microprocessor may be placed in one flexible carrier substrate level, which includes the appropriate and necessary supporting logic, memory devices may be placed on another flexible carrier substrate level, sound and video processors may be placed on another flexible carrier substrate level, and the input/output control devices can be placed on yet another flexible carrier substrate level.

Although the present invention has been described with reference to particular embodiments, the invention is not limited. Many additions, modifications and deletions to the embodiments disclosed herein may be effected without departing from the scope of the invention as defined by the claims appended hereto. Moreover, selected features from one embodiment may be employed with selected features from another embodiment, again within the scope of the invention.

What is claimed is:

1. A computer system comprising:
   an input device;
   an output device;
   a microprocessor coupled to the input device and the output device; and
   a flexible carrier substrate module, coupled to the microprocessor, comprising:
      a flexible carrier substrate having a surface portion carrying conductive traces thereon;
      at least one semiconductor device connected to the conductive traces; and
      a flexible support frame attached to the flexible carrier substrate and having a plurality of conductive paths therethrough connected to the conductive traces to provide electrical coupling of the conductive traces to circuitry external to the flexible carrier substrate.

2. The computer system according to claim 1, wherein the flexible carrier substrate exhibits a first radius of curvature.

3. The computer system according to claim 1, wherein a second flexible carrier substrate is mounted to the flexible support frame.

4. The computer system according to claim 3, wherein the flexible carrier substrate exhibits a first radius of curvature and the second flexible carrier substrate exhibits a second radius of curvature.

5. The computer system according to claim 3, wherein the second flexible carrier substrate has a least one semiconductor device attached thereto.

6. The computer system according to claim 3, wherein the flexible carrier substrate is shaped in a non-planar configuration and the second flexible carrier substrate substantially conforms to a shape of the flexible carrier substrate.

7. The computer system according to claim 1, further comprising a hermetic seal around the flexible carrier substrate module.

8. A computer system comprising:
   an input device;
   an output device;
   a microprocessor coupled to the input device and the output device;
   a rigid substrate having a first set of conductive traces formed on a surface thereof; and
   a flexible carrier substrate module, coupled to the microprocessor, comprising:
      at least one semiconductor device;
      a first flexible carrier substrate having a first and a second end and having a surface portion carrying a second set of conductive traces thereon, wherein the first and second end of the first flexible carrier substrate are mounted to the rigid substrate such that the second set of conductive traces are electrically coupled with the first set of conductive traces and wherein the first flexible carrier substrate exhibits a first radius; and
      a second flexible carrier substrate having a first and second end and having a surface portion carrying a third set of conductive traces thereon, wherein the first and second end of the second flexible carrier substrate are mounted to the rigid substrate such that the third set of conductive traces are electrically coupled with the first set of conductive traces and wherein the second flexible carrier substrate exhibits a second radius different than the first radius.

9. The computer system according to claim 8, further comprising at least one other semiconductor device attached to the rigid substrate.

10. The computer system according to claim 8, wherein the second flexible carrier substrate is superimposed over the first flexible carrier substrate.

11. The computer system according to claim 8, wherein the at least one semiconductor device includes at least a first semiconductor device attached to the first flexible carrier substrate.

12. The computer system according to claim 11, wherein the at least one semiconductor device further includes at least a second semiconductor device attached to the second flexible carrier substrate.

13. The computer system according to claim 11, wherein the rigid substrate is substantially planar.

14. The computer system according to claim 8, wherein the at least one semiconductor device includes a first semiconductor device on the surface of the second flexible carrier substrate and a second semiconductor device on a second, opposing surface of the second flexible carrier substrate.

15. The computer system according to claim 8, further comprising a cover enclosing the flexible carrier substrate module.

16. The computer system according to claim 15, wherein the cover includes a hermetic seal.

17. A computer system comprising:
   an input device;
   an output device;
   a microprocessor coupled to the input device and the output device;
   a rigid substrate; and
   a flexible carrier substrate module, coupled to the microprocessor, comprising:
      a first flexible carrier substrate having a first and a second end wherein the first and second ends of the first flexible carrier substrate are mounted to the rigid substrate;
      a first semiconductor device mounted to the first flexible carrier substrate;
      a second flexible carrier substrate having a first and a second end wherein the first and second ends of the second flexible carrier substrate are mounted to the rigid substrate such that the second flexible carrier substrate is superimposed over the first flexible carrier substrate; and
      a second semiconductor device mounted to the second flexible carrier substrate.

18. The computer system of claim 17, wherein the first flexible carrier substrate further includes a first set of conductive traces, the second flexible carrier substrate includes a second set of conductive traces, and wherein the first and second set of conductive traces are electrically coupled to a third set of conductive traces formed on the rigid substrate.

19. The computer system of claim 7, further comprising a cover enclosing the flexible carrier substrate module.

20. The computer system of claim 19, wherein the cover includes a hermetic seal.

* * * * *